US012289088B2

United States Patent
Liu et al.

(10) Patent No.: US 12,289,088 B2
(45) Date of Patent: Apr. 29, 2025

(54) SURFACE ACOUSTIC WAVE DEVICE AND METHOD FOR FABRICATING THE SAME

(71) Applicant: UNITED MICROELECTRONICS CORP., Hsin-Chu (TW)

(72) Inventors: Hon-Huei Liu, Kaohsiung (TW); Shih-Hung Tsai, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 662 days.

(21) Appl. No.: 17/393,407

(22) Filed: Aug. 4, 2021

(65) Prior Publication Data
US 2023/0009982 A1 Jan. 12, 2023

(30) Foreign Application Priority Data
Jul. 8, 2021 (CN) .......................... 202110771314.1

(51) Int. Cl.
*H03H 3/08* (2006.01)
*H03H 9/02* (2006.01)

(52) U.S. Cl.
CPC .......... *H03H 3/08* (2013.01); *H03H 9/02566* (2013.01); *H03H 9/02574* (2013.01)

(58) Field of Classification Search
CPC .. H03H 9/02; H03H 9/25; H03H 9/64; H03H 3/08
See application file for complete search history.

(56) References Cited

U.S. PATENT DOCUMENTS

| | | | | |
|---|---|---|---|---|
| 7,342,351 | B2* | 3/2008 | Kubo | H03H 3/08 310/344 |
| 9,431,996 | B2* | 8/2016 | Watanabe | H10N 30/87 |
| 10,763,813 | B2* | 9/2020 | Nakamura | H03H 3/0072 |
| 10,931,256 | B2* | 2/2021 | Goto | H10N 30/072 |
| 11,056,532 | B2* | 7/2021 | Then | H01L 29/7786 |
| 11,394,365 | B2* | 7/2022 | Knapp | H03H 9/02834 |
| 11,509,284 | B2* | 11/2022 | Iwamoto | H03H 9/02559 |
| 11,658,635 | B2* | 5/2023 | Hori | H03H 3/08 310/313 A |
| 2017/0063332 | A1 | 3/2017 | Gilbert et al. | |
| 2019/0386639 | A1* | 12/2019 | Iwamoto | H01P 1/20336 |
| 2021/0099152 | A1 | 4/2021 | Goto | |
| 2023/0261638 | A1* | 8/2023 | Daimon | H03H 9/02834 310/313 R |

FOREIGN PATENT DOCUMENTS

JP 2020061684 A * 4/2020
WO 2013172251 11/2013

* cited by examiner

*Primary Examiner* — Andrea Lindgren Baltzell
*Assistant Examiner* — Alan Wong
(74) *Attorney, Agent, or Firm* — Winston Hsu

(57) ABSTRACT

A method for fabricating a surface acoustic wave (SAW) device includes the steps of forming a buffer layer on a substrate, forming a high velocity layer on the buffer layer, forming a medium velocity layer on the high velocity layer, forming a low velocity layer on the medium velocity layer, forming a piezoelectric layer on the low velocity layer, and forming an electrode on the piezoelectric layer. Preferably, the buffer layer includes silicon oxide, the high velocity layer includes graphene, the medium velocity layer includes silicon oxynitride, and the low velocity layer includes titanium oxide.

16 Claims, 1 Drawing Sheet

SURFACE ACOUSTIC WAVE DEVICE AND METHOD FOR FABRICATING THE SAME

BACKGROUND OF THE INVENTION

1. Field of the Invention

The invention relates to a surface acoustic wave (SAW) device and method for fabricating the same, and more particularly, to a SAW device adaptable for hybrid bonding package and method for fabricating the same.

2. Description of the Prior Art

In recent years, volume of communication has increased dramatically in the mobile communication industry primarily represented by mobile phones. To satisfy this immense needs, market has to increase the number of communication channels and various components such SAW devices need to be miniaturized for reaching high performance. Typically, SAW device are made of piezoelectric materials such as lithium niobate ($LiNbO_3$) or lithium tantalite ($LiTaO_3$) and since these materials have larger electromechanical coupling coefficient, wide band could be reached for the device.

Nevertheless in current design of SAW device, issues often arise between high velocity layer disposed on the substrate and surface of the substrate as a result of material mismatch. Hence how to improve the current SAW device structure for resolving this issue has become an important task in this field.

SUMMARY OF THE INVENTION

According to an embodiment of the present invention, a method for fabricating a surface acoustic wave (SAW) device includes the steps of forming a buffer layer on a substrate, forming a high velocity layer on the buffer layer, forming a medium velocity layer on the high velocity layer, forming a low velocity layer on the medium velocity layer, forming a piezoelectric layer on the low velocity layer, and forming an electrode on the piezoelectric layer. Preferably, the buffer layer includes silicon oxide, the high velocity layer includes graphene, the medium velocity layer includes silicon oxynitride, and the low velocity layer includes titanium oxide.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
FIGS. 1-2 illustrate a method for fabricating a SAW device according to an embodiment of the present invention.
Figure 2:
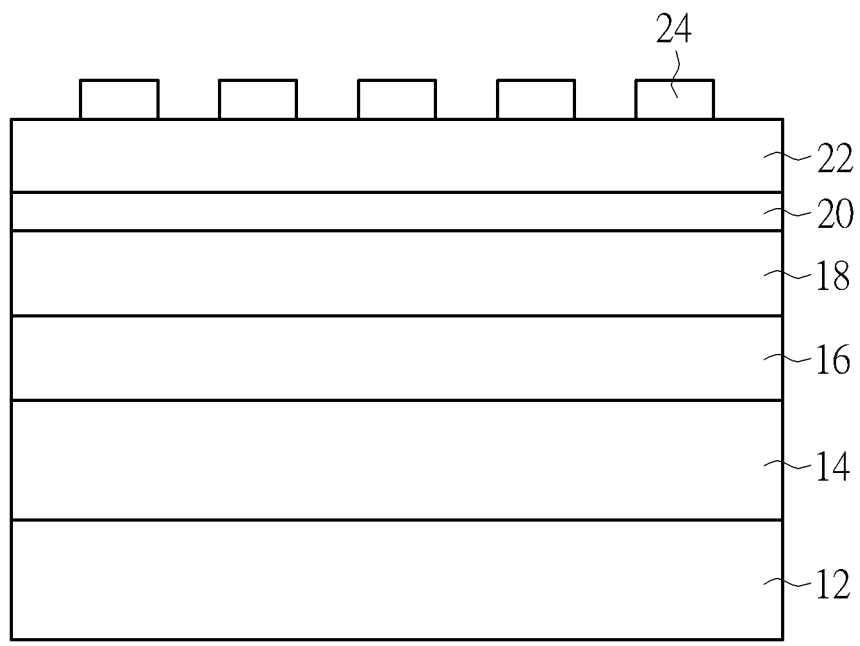

Referring to FIGS. 1-2, FIGS. 1-2 illustrate a method for fabricating a SAW device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). Next, a buffer layer 14 is formed on the surface of the substrate 12, in which the buffer layer 14 is preferably made of dielectric material such as silicon oxide, but not limited thereto.

Next, a high velocity layer 16 is formed on the surface of the buffer layer 14, a medium velocity layer 18 is formed on the surface of the high velocity layer 16, a low velocity layer 20 is formed on the surface of the medium velocity layer 18, and a piezoelectric layer 22 is formed on the surface of the low velocity layer 20. In this embodiment, the buffer layer 14 is disposed to release stress created by the device while each of the high velocity layer 16, the medium velocity layer 18, and the low velocity layer 20 is disposed with corresponding acoustic velocity. Preferably, the acoustic structure made by the combined three layers 16, 18, 20 could be used to adjust the acoustic transmission of the SAW device while reducing disturbance or interference so that acoustic waves could be diffused out much more smoothly.

In this embodiment, the high velocity layer 16 preferably includes graphene, boron carbide, silicon nitride, or combination thereof, the medium velocity layer 18 includes silicon oxynitride (SiON), silicon oxycarbonitride (SiOCN), or combination thereof, the low velocity layer 20 includes titanium oxide ($TiO_2$), silicon oxycarbide (SiOC), or combination thereof, and the piezoelectric layer 22 includes lithium niobate ($LiNbO_3$), lithium tantalite ($LiTaO_3$), or combination thereof.

Next, as shown in FIG. 2, a plurality of electrodes 24 are formed on the surface of the piezoelectric layer 22. In this embodiment, the formation of the electrodes 24 could be accomplished by first performing a deposition process such as chemical vapor deposition (CVD) process to form a metal layer (not shown) on the surface of the piezoelectric layer 22, and then conducting a pattern transfer or photo-etching process by using a patterned mask such as patterned resist to remove part of the metal layer so that the remaining metal layer forms the electrodes 24 on the surface of the piezoelectric layer 22. Structurally, the plurality of electrodes 24 formed at this stage are protruding above the surface of the piezoelectric layer 22 and similar to the aforementioned embodiment, the metal layer or the electrodes 24 are made of conductive or metal material including copper, aluminum, gold, or combination thereof.

Typically, currently SAW device only includes a high velocity layer disposed on the surface of the substrate and/or a low velocity layer disposed on the surface of the high velocity layer. However, due to material characteristic of the high velocity layer poor adhesion has often be found between the high velocity layer and surface of the substrate. To resolve this issue, the present invention preferably forms an additional buffer layer made of silicon oxide between the substrate and high velocity layer for achieving better adhesion. Moreover, according to another embodiment of the present invention, it would also be desirable to form an additional medium velocity layer 18 made of SiON or SiOCN between the high velocity layer and low velocity layer. By combining the high velocity layer, the medium velocity layer, and the low velocity layer altogether to form a composite acoustic structure with an acoustic gradient, the quality and smoothness of acoustic transmission between layers could be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a surface acoustic wave (SAW) device, comprising:
   forming a high velocity layer on a substrate;
   forming a medium velocity layer on the high velocity layer, wherein the medium velocity layer comprises silicon oxynitride (SiON) or silicon oxycarbonitride (SiOCN);
   forming a low velocity layer on the medium velocity layer;
   forming a piezoelectric layer on the low velocity layer; and
   forming an electrode on the piezoelectric layer, wherein the medium velocity layer is between the high velocity layer and the low velocity layer and in direct contact with the high velocity layer and the low velocity layer.

2. The method of claim 1, further comprising forming a buffer layer on the substrate before forming the high velocity layer.

3. The method of claim 2, wherein the buffer layer comprises silicon oxide.

4. The method of claim 1, wherein the high velocity layer comprises graphene.

5. The method of claim 1, wherein the high velocity layer comprises boron carbide.

6. The method of claim 1, wherein the high velocity layer comprises silicon nitride.

7. The method of claim 1, wherein the low velocity layer comprises titanium oxide ($TiO_2$).

8. The method of claim 1, wherein the low velocity layer comprises silicon oxycarbide (SiOC).

9. A surface acoustic wave (SAW) device, comprising:
   a high velocity layer on a substrate;
   a medium velocity layer on the high velocity layer, wherein the medium velocity layer comprises silicon oxynitride (SiON) or silicon oxycarbonitride (SiOCN);
   a low velocity layer on the medium velocity layer;
   a piezoelectric layer on the low velocity layer; and
   an electrode on the piezoelectric layer, wherein the medium velocity layer is between the high velocity layer and the low velocity layer and in direct contact with the high velocity layer and the low velocity layer.

10. The SAW device of claim 9, further comprising a buffer layer between the substrate and the high velocity layer.

11. The SAW device of claim 10, wherein the buffer layer comprises silicon oxide.

12. The SAW device of claim 9, wherein the high velocity layer comprises graphene.

13. The SAW device of claim 9, wherein the high velocity layer comprises boron carbide.

14. The SAW device of claim 9, wherein the high velocity layer comprises silicon nitride.

15. The SAW device of claim 9, wherein the low velocity layer comprises titanium oxide ($TiO_2$).

16. The SAW device of claim 9, wherein the low velocity layer comprises silicon oxycarbide (SiOC).

* * * * *